United States Patent [19]

Koguchi et al.

[11] Patent Number: 5,951,754
[45] Date of Patent: Sep. 14, 1999

[54] METHOD OF FABRICATING SEMICONDUCTOR QUANTUM BOX

[75] Inventors: Nobuyuki Koguchi; Keiko Ishige; Katsuyuki Watanabe; Chea Deak Lee, all of Ibaraki, Japan

[73] Assignee: National Research Institute for Metals, Ibaraki, Japan

[21] Appl. No.: 08/932,829

[22] Filed: Sep. 18, 1997

[51] Int. Cl.[6] .................................................. C30B 19/00
[52] U.S. Cl. .............................. 117/54; 117/97; 117/954; 438/694
[58] Field of Search ................................ 117/54, 97, 954; 438/694

[56] References Cited

U.S. PATENT DOCUMENTS 5,132,247 7/1992 Chikyou et al. .......................... 437/107
5,144,410 9/1992 Johnson .................................... 357/63
5,571,376 11/1996 Bestwick et al. ...................... 156/647.1

*Primary Examiner*—Robert Kunemund
*Assistant Examiner*—Kin-chan Chen
*Attorney, Agent, or Firm*—Wenderoth, Lind & Ponack, L.L.P.

[57] ABSTRACT

A method of fabricating a semiconductor quantum box uniform in size and free from processing damages comprising the steps of adsorbing elements classified in VI family of the periodic table onto the surface of a single or multi-quantum well structure composed of semiconductors; growing crystallites of a semiconductor or a metal by liquid-drop epitaxy; applying chemical etching to the single or multi-quantum well structure with the use of the crystallites as a mask, thereby removing areas of the single or multi-quantum well structure where the crystallites haven't grown on the surface; removing the crystallites used as mask by chemical etching; and filling a semiconductor into the areas of the single or multi-quantum well structure removed in the afore step.

7 Claims, 4 Drawing Sheets

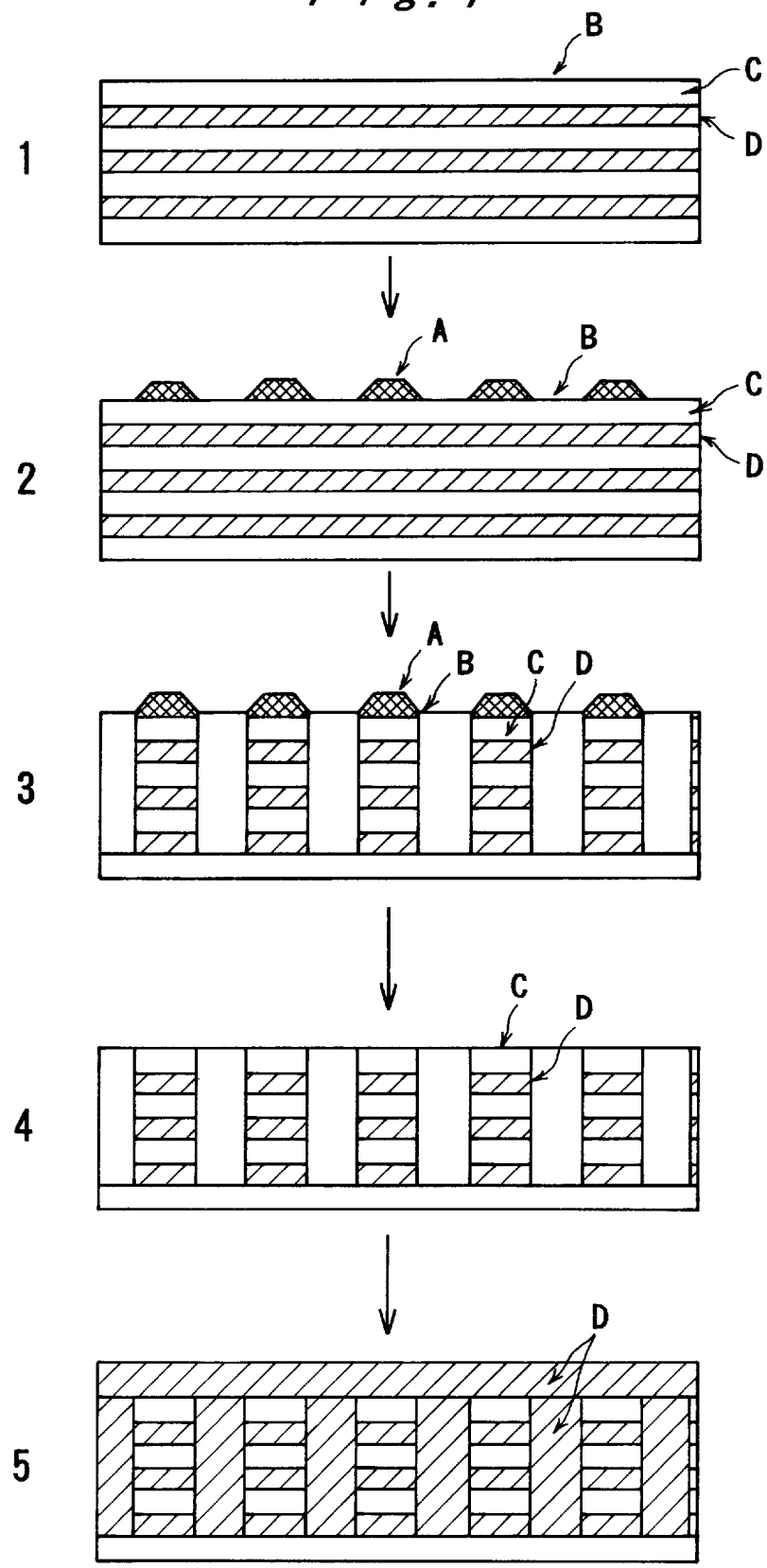

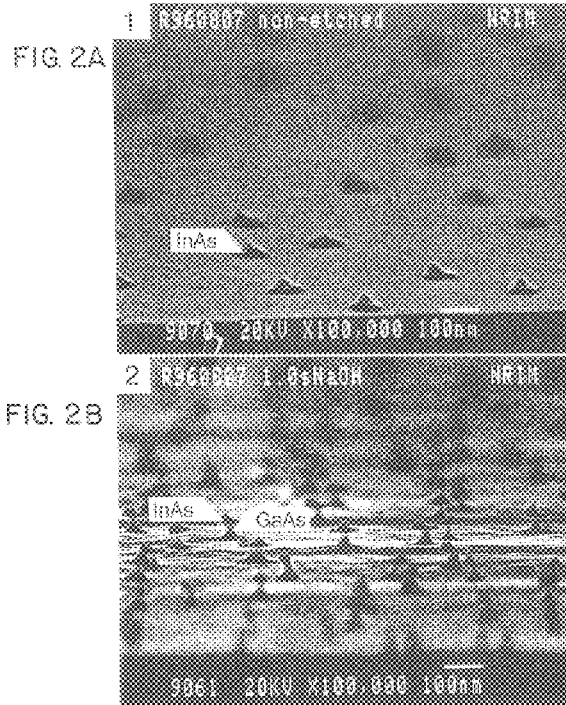
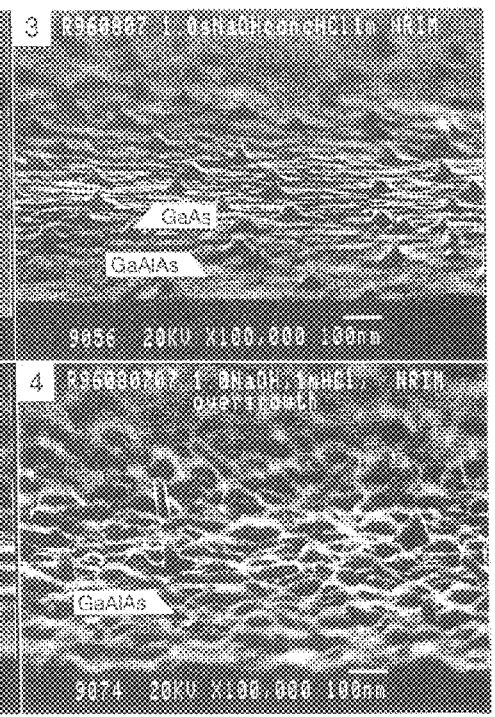
FIG. 2A FIG. 2B FIG. 2C FIG. 2D

METHOD OF FABRICATING SEMICONDUCTOR QUANTUM BOX

BACKGROUND OF THE INVENTION

1. Field of the Invention

The present invention relates to a method of fabricating a semiconductor quantum box and, more particularly, to a novel method which can fabricate a semiconductor quantum box uniform in size and free from processing damages, which is useful for a high-performance semiconductor laser element or a high-speed electronic element.

2. Description of Related Art

Various methods for making a semiconductor quantum box which can be used as a material for a high-performance semiconductor laser element or a high-speed electronic element have been studied from various points of view.

For example, a self-forming type method based on crystal growth and a method based on dry-etching micro-processing have been proposed to make a combination-type semiconductor quantum box. These methods uses crystal growth or dry etching micro-processing to bury semiconductor crystallites regularly in other semiconductor, thereby forming a combination-type semiconductor quantum box in which quantum boxes are arranged regularly close to each other.

However, since the conventional methods so far proposed use either crystal growth or micro-processing based on dry-etching as explained above, it has been impossible to fabricate a combination-type semiconductor quantum box which is uniform in size and has no processing damages.

SUMMARY OF THE INVENTION

In view of the foregoing, it is the main object of the present invention to provide a novel method which solves the foregoing problems of the conventional methods and fabricates a semiconductor quantum box, particularly a combination-type quantum box, uniform in size and free from processing damages through a simple process.

BRIEF DESCRIPTION OF THE DRAWINGS

The foregoing objects, features and advantages of the present invention will be better understood from the following detailed description, taken in conjunction with the accompanying drawings, in which:

FIG. 1 is a schematic illustration of the process of the method of the present invention;

FIG. 2 shows secondary electron photomicrographs of the sample in the process of the method of the present invention;

DETAILED DESCRIPTION OF THE INVENTION

The present invention will now be described with reference to FIG. 1 which schematically illustrates each step of the method of the invention.

In step 1, elements B classified in VI family of the periodic table such as S (sulfur), Se (selenium) and Te (tellurium) are adsorbed onto the surface of a single or multi-quantum well structure composed of semiconductors C and D.

Next, in step 2, by applying liquid-droplet epitaxy method, crystallites A of a metal or a semiconductor are grown on the surface where the VI-family elements B have been adsorbed.

In step 3, chemical etching which has an effect only on the single or multi-quantum well structure and no effect on the crystallites A is applied onto the sample. Therefore, the crystallites A act as mask in this chemical etching process and only the areas of the single or multi-quantum well structure which are not masked by the crystallites A are removed.

Then, in step 4, the crystallites A used as mask are removed by chemical etching.

Finally, in step 5, a buried structure is formed through crystal plane growth of the semiconductor D.

The steps 1 and 2 described above are for growing the size-uniform crystallites A which are used as mask for chemical etching in the step 3, and the steps 3 and 4 applying chemical etching are for achieving a microstructure free from processing damages, then the final step 5 is essential for forming a quantum box by enclosing electrons or holes three-dimensionally in a fine space.

Various substances can be selected and used as the semiconductor C, the semiconductor D, the element B classified in VI family of the periodic table and the crystallites A, and then an appropriate etchant for chemical etching in the steps 3 and 4 would be selected depending on the thus selected substances.

Now, the invention will be described further in detail below by means of examples.

EXAMPLE 1

FIG. 2 illustrates secondary electron photomicrographs (100,000 magnifications) showing an example of application of the invention.

First of all, sulfur (S) atoms were adsorbed in vacuum onto the surface of a single or multi-quantum GaAs/GaAlAs well structure prepared by the molecular beam epitaxy method, then fine InAs crystallites were accumulated on the resultant surface of a single or multi-quantum GaAs/GaAlAs by applying liquid-drop epitaxy (FIG. 2-1).

Then, using the accumulated InAs crystallites as mask, chemical etching was applied for one second in an IN—$NaOH:H_2O_2:H_2O=2:1:17$ mixed solution (FIG. 2-2). The mixed solution has an effect only on GaAs/GaAlAs single or multi-quantum well structure and no effect on the InAs crystallites.

Figure 3:
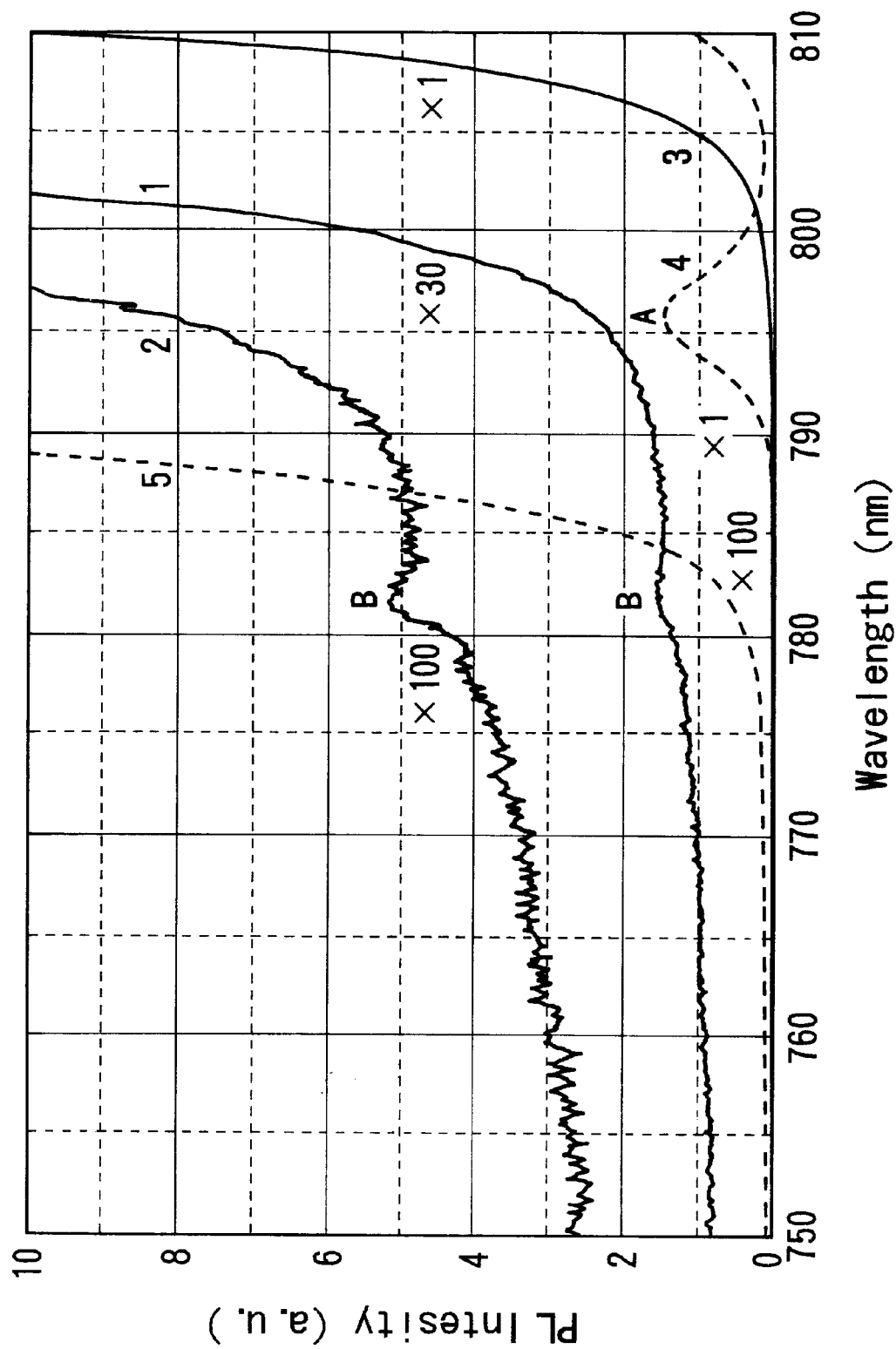
FIG. 3 shows photoluminescence spectra of the sample shown in FIG. 2 at a temperature of 20 K.

Further, the thus chemically etched sample was immersed for one minute in an HCl (concentration: 35%) solution, and the InAs crystallite mask and sulfur (S) were removed by chemical etching (FIG. 2-3). At this point, HCl has an effect only on the InAs crystallite mask and does not affect the GaAs/GaAlAs single or multi-quantum well structure.

Figure 4A:
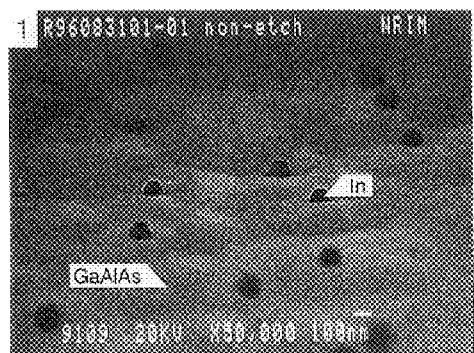
FIG. 4 shows secondary electron photomicrographs of another sample in the process of the method of the present invention.
Figure 4B:
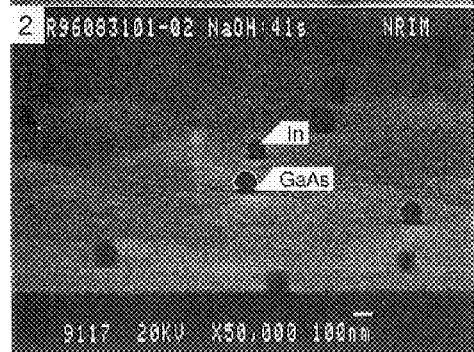
Figure 4C:
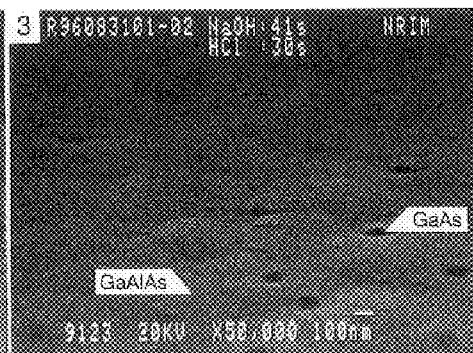

The sample resulting from the aforesaid chemical etching was brought back to the molecular beam epitaxy apparatus, thus completing a buried structure through growth of the GaAlAs thin film (FIG. 2-4).

Through the foregoing steps, a semiconductor quantum box uniform in size and free from processing damages was formed.

FIG. 3 is a graph illustrating photo-luminescence spectra of the sample corresponding to the steps shown in FIG. 2 at a temperature of 20 K.

In FIG. 3, spectra 1, 2 and 3 are values of luminescence from the sample having a quantum box structure of FIG. 2-4, and the spectra 4 and 5 are those from the sample having the structure before application of chemical etching of FIG. 2-1.

It is clear from FIG. 3 that the spectras 1, 2 and 3 does not have the peak A which can be seen in the spectras 4 and 5; instead, there is a different peak B based on the quantum size effect appeared anew on the shorter wavelength side.

EXAMPLE 2

A semiconductor quantum box was formed under the same conditions in the same steps as in the Example 1, except that, in place of InAs, metallic In crystallites were grown and accumulated by liquid-drop epitaxy.

FIG. 4 illustrates secondary electron photomicrographs (50,000 magnifications) showing the state as described above.

The sulfur (S) which is classified in VI-family of the periodic table was adsorbed onto the surface of a semiconductor GaAs/GaAlAs single or multi-quantum well structure, and metallic In crystallites were accumulated on the surface thereof by the liquid-droplet epitaxy method (FIG. 4-1).

Chemical etching was applied with the In crystallites as a mask (FIG. 4-2).

Chemical etching was further applied to remove In and S, then GaAlAs was buried by regrowth (FIG. 4-3).

Thus, a semiconductor quantum box uniform in size and free from processing damages was formed.

It is needless to mention that the invention is not limited to the foregoing examples, but various modifications are possible in details, and various means and steps may be added to the above-mentioned steps.

According to the present invention, as described above in detail, it is possible to form a semiconductor quantum box uniform in size and free from processing damages through a simple process.

What is claimed is:

1. A method of fabricating a semiconductor quantum box comprising at least the steps of:
   (1) adsorbing an element classified in Group VI of the periodic table to a surface of a single or multi-quantum well structure composed of a plurality of semiconductors;
   (2) growing, by liquid-drop epitaxy, a plurality of crystallites of a metal or an another semiconductor which is different from said plurality of semiconductors on the surface of said single or multi-quantum well structure where the element in Group VI has been adsorbed;
   (3) applying chemical etching, which has an etching effect only on the single or multi-quantum well structure, to the single or multi-quantum well structure with the use of the plurality of crystallites as a plurality of masks, thereby removing areas of the single or multi-quantum well structure where the plurality of crystallites have not grown on the surface;
   (4) removing the plurality of crystallites used as the plurality of masks by further chemical etching which has an etching effect only on the plurality of crystallites; and
   (5) forming a buried structure by filling one of the plurality of semiconductors into the areas of the single of multi-quantum well structure removed in the step (4) through crystal plane growth of said one of the plurality of semiconductors.

2. The method according to claim 1, wherein the element of Group VI of the periodic table in S, Se or Te.

3. The method according to claim 1, wherein the crystallites are comprised of In or InAs.

4. The method according to claim 1, wherein the single or multi-quantum well structure is comprised of GaAs/GaAlAs.

5. The method according to claim 1, wherein the single or multi-quantum well structure is chemically etched with a solution of In—NaOH:$H_2O_2$:$4_2O$.

6. The method according to claim 1, wherein the crystallites are removed with a solution of HCl.

7. The method according to claim 1, wherein the buried structure is formed by growth of a GaAlAs thin film on the etched surface.

* * * * *